United States Patent
Chow

(10) Patent No.: US 6,772,377 B2
(45) Date of Patent: Aug. 3, 2004

(54) CONVOLUTIONAL INTERLEAVING WITH INTERLEAVE DEPTH LARGER THAN CODEWORD SIZE

(75) Inventor: Frances Chow, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 529 days.

(21) Appl. No.: 09/966,681

(22) Filed: Sep. 28, 2001

(65) Prior Publication Data

US 2003/0070138 A1 Apr. 10, 2003

(51) Int. Cl.[7] .......................................... H03M 13/27
(52) U.S. Cl. ..................................................... 714/701
(58) Field of Search ................................ 714/701, 702

(56) References Cited

U.S. PATENT DOCUMENTS

| | | | | |
|---|---|---|---|---|
| 5,737,337 A | * | 4/1998 | Voith et al. ................... | 714/702 |
| 5,898,698 A | * | 4/1999 | Bross .......................... | 714/701 |
| 5,907,560 A | * | 5/1999 | Spruyt ......................... | 714/701 |
| 5,983,388 A | * | 11/1999 | Friedman et al. ............ | 714/776 |
| 6,151,690 A | * | 11/2000 | Peeters ........................ | 714/701 |
| 6,536,001 B1 | * | 3/2003 | Cai et al. ..................... | 714/701 |
| 6,546,509 B2 | * | 4/2003 | Starr ............................ | 714/704 |
| 6,625,219 B1 | * | 9/2003 | Stopler .................... | 375/240.27 |
| 6,651,194 B1 | * | 11/2003 | Huang et al. ................ | 714/701 |
| 6,654,410 B2 | * | 11/2003 | Tzannes ...................... | 375/222 |
| 6,667,991 B1 | * | 12/2003 | Tzannes ...................... | 370/465 |
| 6,670,898 B1 | * | 12/2003 | Lifshitz ........................ | 341/81 |
| 6,697,975 B2 | * | 2/2004 | Cameron ..................... | 714/702 |

* cited by examiner

*Primary Examiner*—Stephen M. Baker
(74) *Attorney, Agent, or Firm*—J. Dennis Moore; W. James Brady, III; Frederick J. Telecky, Jr.

(57) ABSTRACT

The present invention provides a solution for interleaving data frames, in a digital subscriber line system in which the data frames are divided into first and second codewords such that the first codeword comprises an even number of data bytes and the second codeword comprises an odd number of data bytes. With an interleaver depth (D) greater than a number of data bytes in the codewords (N), the codewords are written to a first matrix (51) in a predetermined manner (220), and read from the first matrix (51) in a predetermined manner (240 or 250) in which the data bytes of the codewords are delayed by a number of bytes. The codeword data bytes (defined by: $B_0, B_1, \ldots, B_{N-1}$) are delayed by an amount that varies linearly with a byte index, where byte Bi (with index i) is delayed by $(D-1) \times i$ bytes. Further, de-interleaving the interleaved data frames can be implemented by a reverse interleaving writing (340 or 350) and reading (320) in a second matrix (52).

20 Claims, 2 Drawing Sheets

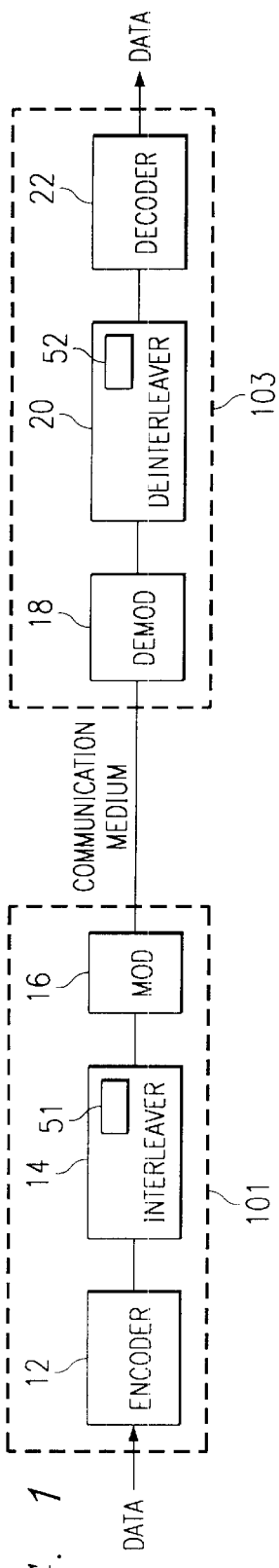

FIG. 3

320 — WHEN READING FROM THE DEINTERLEAVER MATRIX
ADD ONE DUMMY BYTE TO THE BEGINNING OF THE FIRST CODEWORD
ADD TWO DUMMY BYTES TO THE BEGINNING OF THE SECOND CODEWORD

IS $\lfloor D/N \rfloor$ ODD?

340 — YES
WHEN WRITING TO THE DEINTERLEAVER MATRIX
FIRST AND SECOND CODEWORD SWAPS SIZES
ADD ONE DUMMY BYTE AT THE BEGINNING AND AT $(D - \lfloor D/N \rfloor \times N + 1)$th BYTE OF FIRST CODEWORD
ADD ONE DUMMY BYTE AT THE BEGINNING OF THE SECOND CODEWORD 350 — NO
WHEN WRITING TO THE DEINTERLEAVER MATRIX
ADD ONE DUMMY BYTE AT THE BEGINNING OF THE FIRST CODEWORD
ADD ONE DUMMY BYTE AT THE BEGINNING AND AT THE $(D - \lfloor D/N \rfloor \times N + 1)$th BYTE OF THE SECOND CODEWORD

DONE

FIG. 4

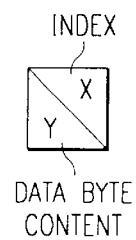

INTERLEAVE READ OR DEINTERLEAVE WRITE DIRECTION →

INTERLEAVE WRITE OR DEINTERLEAVE READ DIRECTION ↓

| 0 # | 1 | 2 | 3 # | 4 | 5 # | 6 | 7 |
| 8 F1 | 9 | 10 # | 11 | 12 | 13 # | 14 | 15 # |
| 16 F2 | 17 | 18 | 19 | 20 # | 21 S1 | 22 | 23 # |
| 24 F3 | 25 # | 26 | 27 | 28 | 29 S2 | 30 # | 31 |
| 32 F4 | 33 # | 34 | 35 # | 36 | 37 S3 | 38 | 39 |

N

D

INDEX: X / Y
DATA BYTE CONTENT

CONVOLUTIONAL INTERLEAVING WITH INTERLEAVE DEPTH LARGER THAN CODEWORD SIZE

BACKGROUND OF THE INVENTION

1. Technical Field of the Invention

The present invention relates generally to the field of communications and, more particularly, to interleaving data frames in a digital subscriber line system.

2. Description of the Related Art

Digital communication systems that are subject to bursty errors often use the technique known as "interleaving" in cooperation with error correction, such as Reed-Solomon (R-S) encoding and decoding techniques where a data stream is transformed into a sequence of error protected packets of data, to improve system reliability. Generally, there are two types of interleaving approaches; a block interleaver and a convolutional interleaver. The block interleaver interleaves the data stream in block units, comprising of rows and columns and randomizes the data stream by varying the input/output sequence. That is, the input data stream is horizontally scanned to be stored in a memory and the data stored in the memory is vertically scanned to be outputted. In a deinterleaver, the inverse permutation is accomplished by vertically scanning the data stream into a memory and then the stored data is horizontally scanned out of the deinterleaver.

In the convolutional interleaver, the input data is temporarily stored in the memory for a predetermined delay, and the same memory is used for reading and writing, which happen alternately. This group of interleavers results in an easier synchronization scheme, reduces the end-to-end latency and requires a smaller memory configuration while achieving the same performance.

For asymmetric digital subscriber line (ADSL) communication systems, convolutional interleaving and de-interleaving techniques on either end of the transmission path are used to interleave the data stream so that the effects of burst errors become distributed when the packet data is de-interleaved in a receiver or modem, and do not overwhelm the error correcting and detecting codes.

A convolutional interleaving approach used in many ADSL systems is that detailed in the G.992.1 International Telecommunication Union standard for "Asymmetrical Digital Subscriber Line (ADSL) Transceivers" which provides for interleaving data frames based on Reed-Solomon coding and convolutional interleaving (similar standards may be provided by the American National Standards Institute). The Reed-Solomon codewords are convolutionally interleaved to a depth (D) that varies and that is defined by the rule that each of the N bytes $B_0, B_1, \ldots B_{N-1}$ in a Reed-Solomon codeword is delayed an amount that varies linearly with the byte index. More precisely, byte $B_i$ (with index i) is delayed by (D–1) x i bytes, where D is the interleaving depth. Further, D varies but is always a power of 2.

With a rate of 4,000 data frames per second and a maximum R-S codeword of 255 bytes per data frame, the ADSL downstream line rate is limited to approximately 8 Mbit/s per latency path. This transmission rate limitation is avoided by putting more than one codeword in an interleaved data frame. That is, the line rate limit can be increased to about 16 Mbit/s for the interleaved path by mapping two R-S codewords into one forward error correction (FEC) data frame. When the number of data bytes in a data frame cannot be packed into one R-S codeword or when it is preferable to have two codewords to increase the error-correction capability, the data bytes are split into two consecutive R-S codewords. When this number of data bytes in the data frame is even, the first and second codeword have the same length, otherwise the first codeword is one byte longer than the second.

Further, for the G.992.1 International Telecommunication Union standard, the convolutional interleaving requires all codewords to have the same odd length. To achieve the odd codeword length, insertion of a dummy (not transmitted) data byte is required for codewords with an even length. The dummy data byte addition to the first and/or second codeword at the input of the interleaving operation is shown in Table 7–9 of section 7.6.4 of the aforementioned standard (shown as Table 1 in the present application).

TABLE 1

| R-S1 | R-S2 | Dummy Byte Insertion Action |
|---|---|---|
| odd | odd | no action |
| even | even | Add one dummy byte at the beginning of both codewords |
| odd | even | Add one dummy byte at the beginning of the second codeword |
| even | odd | Add one dummy byte at the beginning of the first codeword and two dummy bytes at the beginning of the second codeword (the de-interleaver shall insert one dummy byte into the de-interleaver matrix on the first byte and the (D + 1)th byte of the corresponding codeword to make the addressing work properly) |

In the G.992.1 International Telecommunication Union standard, D is always a power of 2, such that N and D can be made co-prime by adding dummy bytes according to Section 7.63 and 7.6.4. However, it is implicitly assumed in the standard that N is always larger than D. If that is not the case, which is certainly possible in some applications, the convolutional interleaving will not be done correctly using the existing rules under the following conditions: (1) There are two codewords in a DMT symbol; and (2) the length of the first codeword is even; and (3) the length of the second codeword is odd.

In view of the foregoing, an improved interleaving scheme which enables convolutional interleaving in applications which include an interleave depth larger than the codeword size.

SUMMARY OF THE INVENTION

The present invention achieves technical advantages as an apparatus and method of interleaving data frames in a digital subscriber line system in which the data frames are divided into first and second codewords such that the first codeword comprises an even number of data bytes and the second codeword comprises an odd number of data bytes. The codewords are written to a first matrix in predetermined manner with an interleaver depth (D) greater than the number of data bytes in the codewords, including the dummy bytes inserted (N), and read from the first matrix in a predetermined manner in which the data bytes of the codewords are delayed by a number of bytes. The codeword data bytes (defined by: $B_0, B_1, \ldots, B_{N-1}$) are delayed by an amount that varies linearly with a byte index, where byte Bi (with index i) is delayed by (D–1) x i bytes. Further, de-interleaving the interleaved data frames can be implemented by a reverse interleaving writing and reading in a second matrix.

BRIEF DESCRIPTION OF THE DRAWINGS

For a more complete understanding of the present invention, reference is made to the following detailed description taken in conjunction with the accompanying drawings wherein:

FIG. 1 illustrates a block diagram of an interleaving system which includes a transmitter, receiver, and a communication medium;

FIG. 2 illustrates a flow diagram of a method for interleaving data frames in accordance with an exemplary embodiment of the present invention;

FIG. 3 illustrates a flow diagram of a method for deinterleaving data frames in accordance with an exemplary embodiment illustrated in FIG. 2; and FIG. 4 illustrates an exemplary matrix showing an overview of the codewords and data bytes which are written in the memory cells.

DETAILED DESCRIPTION OF THE INVENTION

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others.

The following embodiments are described in terms of interleaving data frames in an ADSL system in which the data frames are divided into first and second codewords such that the first codeword comprises an even number of data bytes and the second codeword comprises an odd number of data bytes where the codeword data bytes (defined by: $B_0$, $B_1$, ..., $B_{N-1}$) are delayed by an amount that varies linearly with a byte index, where byte Bi (with index i) is delayed by (D-1) x i bytes as further described in the G.992.1 International Telecommunication Union standard for "Asymmetrical Digital Subscriber Line (ADSL) Transceivers", the description of which is herein incorporated by reference.

Referring now to FIG. 1 there is illustrated a block diagram of an interleaving system which includes a transmitter 101, receiver 103, and a communication medium. This system can be included in an ADSL communication system for interleaving data frames (further described below). The transmitter 101 includes an encoder 12 which encodes an incoming data stream, an interleaver 14 coupled to the encoder 12 and configured to interleave the encoded data, and a modulator 16 coupled to the interleaver 14 and operably configured to modulate the interleaved data for transmission over the communication medium. The modulated data signal is then received by the receiver 103 which includes a demodulator 18 for demodulating the received signal, a deinterleaver 20 for deinterleaving the demodulated signal, and a decoder 22 for decoding the deinterleaved signal and outputting the data stream.

The interleaver 14 includes a matrix or buffer 51 having a predetermined number of columns and a predetermined number of rows set equal to the number of data bytes in a codeword (N). The number of columns are set equal to the interleave depth D which is generally know as the maximum length of a burst error that does not corrupt more than one data byte in the same codeword. The deinterleaver 20 includes a similar matrix 52. The interleaver matrix 51 and deinterleaver matrix 52 can include a convolutional buffer or other similar device. Further, the interleaver matrix 51 and deinterleaver matrix 52 can include writing and reading devices or circuits adapted to write into and read from each matrix.

Referring now to FIG. 2 there is illustrated a flow diagram of a method for interleaving data frames in accordance with an exemplary embodiment of the present invention which can be implemented in the interleaver 14 illustrated in FIG. 1. When there are two codewords in a DMT symbol in which the length of the first codeword is even and the length of the second codeword is odd, an approach of adding dummy bytes in accordance with the present invention is as follows for interleaving: When writing 220 to the interleaver matrix 51 (see FIG. 1), one dummy byte is added at the beginning of the first codeword and two dummy bytes are added at the beginning of the second codeword.

When reading from the interleaver matrix 51, if $\lfloor D/N \rfloor$ is odd 240, the sizes of the two codewords are swapped, i.e. when reading from the interleaver matrix 51, the first codeword assumes the size of the second codeword while the second codeword assumes the size of the first codeword. This swapping must occur in order to maintain the correct number of bytes in the two codewords. For example, let the size of the first codeword, N1=4, and the size of the second codeword, N2=3. In this case, N=5. During interleave write, 1 byte is added to the first codeword such that N1+1=N, and 2 bytes are added to the second codeword such that N2+2=N. During interleave read, if $\lfloor D/N \rfloor$ is odd, the rule is to add 2 bytes to the first codeword and 1 byte to the second codeword. As such, if the sizes are not swapped, N1+2=6>N and N2+1=4<N. Only if the sizes are swapped, such that N1'=3 and N2'=4, will the operation work.

With this temporary codeword size swapping, one dummy byte is added at the beginning and at the $(D-\lfloor D/N \rfloor \times N+1)$th byte of the first codeword, and one dummy byte is added at the beginning of the second codeword; if $\lfloor D/N \rfloor$ is even 250, no codeword size swapping is needed, and one dummy byte is added at the beginning of the first codeword, and one dummy byte is added at the beginning and at the $(D-\lfloor D/N \rfloor \times N+1)$th byte of the second codeword. This approach is general to any relationship between N and D, as long as they are co-prime, and is particularly advantageous when D is larger than N.

Referring now to FIG. 3 there is illustrated a flow diagram of a method for deinterleaving data frames in accordance with an exemplary embodiment of the present invention which can be implemented in the deinterleaver 20 illustrated in FIG. 1. Deinterleaving, following the above-described interleaving operation, in accordance with an exemplary embodiment of the present invention, is as follows (note that the writing and reading sequence is reversed, i.e., reading occurs before writing): When reading 320 from the deinterleaver matrix 52 (see FIG. 1), one dummy byte is added at the beginning of the first codeword and two dummy bytes are added at the beginning of the second codeword 340.

When writing to the deinterleaver matrix 52, if $\lfloor D/N \rfloor$ is odd 340, the sizes of the two codewords are swapped, i.e. when writing from the deinterleaver matrix 52, the first codeword assumes the size of the second codeword while the second codeword assumes the size of the first codeword. With this temporary codeword size swapping, one dummy byte is added at the beginning and at the $(D-\lfloor D/N \rfloor \times N+1)$th byte of the first codeword, and one dummy byte is added at the beginning of the second codeword; if $\lfloor D/N \rfloor$ is even 350, no codeword size swapping is needed, and one dummy byte is added at the beginning of the first codeword, and one dummy byte is added at the beginning and at the $(D-\lfloor D/N \rfloor \times N+1)$th byte of the second codeword. Again, this solution is general to any relationship between N and D as long as they are co-prime.

Referring now to FIG. 4 there is illustrated an exemplary matrix showing an overview of the codewords and data bytes which are written in the memory cells. For this example, D is assumed to be eight (8) and N is assumed to be five (5) with the first codeword size (N1) equal to four (4) and the second codeword size (N2) equal to three (3). Thus, $\lfloor D/N \rfloor = \lfloor 8/5 \rfloor = 1$ which is odd.

It takes 8 (=D) codewords to fill this matrix. Dummy bytes added are denoted by "#". For interleaving, writing occurs first with the bytes F1, F2, F3, F4 of the first codeword written. Then when reading occurs, since $\lfloor D/N \rfloor$ is odd, there is a swap of codeword sizes, and locations 1, 2, 4 are read as the "first" codeword. Then writing of the second codeword occurs with S1, S2, S3 written. Then reading of the "second" (size swapped) codeword occurs and locations 6, 7, 8, 9 are read. In this DMT symbol, 7 bytes are inputted and outputted. In the next DMT symbol, the first codeword is written at locations 18, 26, 34 and 2, and reading from the matrix occurs at locations 11, 12 and 14. The second codeword is written at locations 31, 39 and 7, and reading from the matrix occurs at locations 16, 17, 18 and 19. It can be seen that the writings are done vertically in columns, while the readings are done horizontally. The writing and reading start at the same location (the location could be a dummy byte) for each codeword.

We can use the same matrix to illustrate deinterleaving. In deinterleaving, reading occurs before writing. In the first DMT symbol, locations 8, 16, 24, 32 are read for the first codeword. Then, location 1, 2, 4 are written. (Note the codeword size swapping during deinterleaving write). Then, locations 21, 29, 37 (second codeword) are read. Finally locations 6, 7, 8, 9 are written. In the next DMT symbol, the first codeword is read from locations 18, 26, 34 and 2, while locations 11, 12, and 14 are written. The second codeword is read from locations 31, 39 and 7, while locations 16, 17, 18 and 19 are written. Again, although there is a swapping of codeword size in writing, the total number of bytes inputted and outputted are the same. (7 in this case).

In this example, note that one dummy byte is added to the beginning of the first codeword and two are added to the beginning of the second codeword during interleave write or deinterleave read. Also note that one dummy byte is added to the beginning and $D - \lfloor D/N \rfloor \times N + 1 = 4^{th}$ byte of the first codeword and one dummy byte is added to the beginning of the second codeword during interleave read or deinterleave write.

Although the aforementioned embodiments are described for particular implementation in ADSL applications, the present invention can be implemented in other transmission systems, e.g. radio transmission applications and coax cable applications. Further, although a preferred embodiment of the apparatus and method of the present invention has been illustrated in the accompanied drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. A method for convolutional interleaving in a digital subscriber line system, wherein a discrete multi-tone symbol comprises a first and second codeword such that said first codeword comprises an even number of data bytes and said second codeword comprises an odd number of data bytes, comprising:

writing said first codeword into a first column of an interleaver matrix and said second codeword into a second column of said interleaver matrix, said interleaver matrix comprising a predetermined number of rows (N) and columns (D), said writing further including appending one dummy data byte to a beginning of said first codeword and two said dummy data bytes to a beginning of said second codeword; and reading said codewords from said interleaver matrix row-by-row such that data bytes in said codewords are delayed by a number of bytes, and if $\lfloor D/N \rfloor$ is odd, wherein $\lfloor \; \rfloor$ denotes the largest integer smaller than or equal to:
    inverting a size of said first and said second codeword;
    appending one said dummy data byte to said beginning of said first codeword;
    appending one said dummy data byte at a $(D - \lfloor D/N \rfloor \times N + 1)$th byte of said first codeword;
    appending one said dummy data byte at said beginning of said second codeword; and if $\lfloor D/N \rfloor$ is even:
    appending one said dummy data byte at said beginning of said first codeword;
    appending one said dummy data byte at said beginning of said second codeword; and
    appending one said dummy data byte at a $(D - \lfloor D/N \rfloor \times N + 1)$th byte of said second codeword.

2. The method of claim 1, wherein D is a power of two.

3. The method of claim 1, wherein D is larger than N.

4. The method of claim 1, wherein D represents an interleave depth.

5. The method of claim 1, wherein said number of rows and said number columns of said interleaver matrix are co-prime.

6. The method of claim 1 further including deinterleaving said codewords comprising:

reading from a deinterleaving matrix in a column-by-column manner, said reading further including appending one dummy data byte to a beginning of said first codeword and two dummy data bytes to a beginning of said second codeword; and writing to said deinterleaver matrix in a row-by-row manner said codewords read from said interleaver matrix; and if $\lfloor D/N \rfloor$ is odd:
    inverting said number of data bytes of said first and said second codeword;
    appending one dummy data byte to said beginning of said first codeword; and
    appending one dummy data byte to a $(D - \lfloor D/N \rfloor \times N + 1)$th byte of said first codeword; and
    appending one dummy data byte to said beginning of said second codeword; and if $\lfloor D/N \rfloor$ is even:
    appending one dummy data byte to said beginning of said first codeword; and
    appending one dummy data byte to said beginning of said second codeword; and
    appending one dummy data byte to a $(D - \lfloor D/N \rfloor \times N + 1)$th byte of said second codeword.

7. The method of claim 1, wherein N is determined from the number of data bytes, including the dummy bytes, inserted in a codeword.

8. The method of claim 7, wherein codeword data bytes defined by:

$B_0, B_1, \ldots, B_{N-1}$, are delayed by an amount that varies linearly with a byte index, wherein byte Bi with index i is delayed by $(D-1) \times i$ bytes, wherein D is an interleave depth.

9. A method of interleaving data frames in a digital subscriber line system, wherein the data frames are divided into a first and second codeword such that said first codeword comprises an even number of data bytes and said second codeword comprises an odd number of data bytes, comprising:
 writing said codewords to a first matrix device in predetermined manner, said first matrix device defined by an interleaver depth (D) greater than a number of data bytes in said codewords (N); and
 reading from said first matrix device in a predetermined manner, wherein data bytes of said codewords are delayed by a number of bytes, said codeword data bytes defined by:
 $B_0, B_1, \ldots, B_{N-1}$, are delayed by an amount that varies linearly with a byte index, wherein byte Bi with index i is delayed by (D−1)×i bytes.

10. The method of claim 9, wherein D is a power of two.

11. The method of claim 9, wherein D and N are co-prime.

12. The method of claim 9 further comprising:
 reading from a second matrix device by appending one dummy data byte to a beginning of said first codeword and two said dummy bytes to a beginning of said second codeword; and deinterleaving data bytes received from said first matrix device, comprising:
 writing to said second matrix in a row-by-row and
 if ⌊D/N⌋ is odd:
 inverting a size of said first and second codeword;
 appending one dummy data byte to said beginning of said first codeword; and
 appending one dummy data byte to a (D−⌊D/N⌋×N+1)th byte of said first codeword; and
 appending one dummy data byte to said beginning of said second codeword; and
 if ⌊D/N⌋ is even:
 appending one dummy data byte to said beginning of said first codeword; and
 appending one dummy data byte to said beginning of said second codeword; and
 appending one dummy data byte to a (D−⌊D/N⌋×N+1)th byte of said second codeword.

13. The method of claim 9, wherein said predetermined writing manner comprises appending one dummy data byte to a beginning of said first codeword and two said dummy data bytes to a beginning of said second codeword.

14. The method of claim 13, wherein said predetermined reading manner comprises:
 if ⌊D/N⌋ is odd, wherein ⌊ ⌋ denotes the largest integer smaller than or equal to:
 inverting a size of said first and second codeword;
 appending one said dummy data byte to said beginning of said first codeword;
 appending one said dummy data byte to a (D−⌊D/N⌋×N+1)th byte of said first codeword;
 appending one said dummy data byte to said beginning of said second codeword; and
 if ⌊D/N⌋ is even:
 appending one said dummy data byte to said beginning of said first codeword;
 appending one said dummy data byte to said beginning of said second codeword; and
 appending one said dummy data byte to a (D−⌊D/N⌋×N+1)th byte of said second codeword.

15. An apparatus for interleaving data frames in a digital subscriber line system wherein a discrete multi-tone symbol comprises a first and second codeword such that said first codeword comprises a size of an even number of data bytes and said second codeword comprises a size of an odd number of data bytes, comprising:
 an interleave buffer having a predetermined number of columns and rows and adapted to store data bytes;
 a first writing device having an input for receiving said first and second codeword and adapted to write said first and said second codeword to said interleave buffer with a predetermined method when an interleave depth (D) is larger than a number of data bytes (N) in said symbol;
 a first reading device adapted to read data bytes from said interleave buffer with a predetermined method.

16. The apparatus of claim 15, wherein said predetermined write method comprises writing said first codeword into a first column of an interleaver buffer and said second word into a second column of said interleaver buffer, said interleaver buffer comprising a predetermined number of rows (N) and columns (D), said writing further including appending one dummy data byte to a beginning of said first codeword and two said dummy data bytes to a beginning of said second codeword.

17. The apparatus of claim 16, wherein said predetermined read method comprises:
 reading said codewords from said interleaver buffer row-by-row; and
 if ⌊D/N⌋ is odd, wherein ⌊ ⌋ denotes the largest integer smaller than or equal to:
 inverting said size of said first and second codeword;
 appending one said dummy data byte to said beginning of said first codeword;
 appending one said dummy data byte to a (D−⌊D/N⌋×N+1)th byte of said first codeword;
 appending one said dummy data byte to said beginning of said second codeword; and
 if ⌊D/N⌋ is even:
 appending one said dummy data byte to said beginning of said first codeword;
 appending one said dummy data byte to said beginning of said second codeword; and
 appending one said dummy data byte to a (D−⌊D/N⌋×N+1)th byte of said second codeword.

18. The apparatus of claim 17 further comprising:
 a deinterleaver buffer having a predetermined number of columns and rows and adapted to store data bytes;
 a second writing device having an input for receiving data bytes read from said interleave buffer and adapted to write said received data bytes to said deinterleaving buffer with said predetermined method of said first reading device; and
 a second reading device adapted to read data bytes from said deinterleaver buffer with said predetermined method of said first writing device.

19. The apparatus of claim 18, wherein said predetermined read method comprises appending one dummy data byte to a beginning of said first codeword and two said dummy data bytes to a beginning of said second codeword.

20. The apparatus of claim 18, wherein said predetermined write method comprises:
 reading said codewords from said interleaver buffer row-by-row, and
 if ⌊D/N⌋ is odd, wherein ⌊ ⌋ denotes the largest integer smaller than or equal to:
 inverting said size of said first and second codeword;
 appending one said dummy data byte to said beginning of said first codeword;

appending one said dummy data byte to a (D−⌊D/N⌋×N+1)th byte of said first codeword;

appending one said dummy data byte to said beginning of said second codeword; and if ⌊D/N⌋ is even:

appending one said dummy data byte to said beginning of said first codeword;

appending one said dummy data byte to said beginning of said second codeword; and appending one said dummy data byte to a (D−⌊DN⌋×N+1)th byte of said second codeword.

* * * * *

UNITED STATES PATENT AND TRADEMARK OFFICE
CERTIFICATE OF CORRECTION

PATENT NO.   : 6,772,377 B2
DATED        : August 3, 2004
INVENTOR(S)  : Chow

It is certified that error appears in the above-identified patent and that said Letters Patent is hereby corrected as shown below:

<u>Title page,</u>
Item [75], Inventors, change name to:
-- Francis Chow, San Jose, CA (US) --

Signed and Sealed this

Eighth Day of March, 2005

JON W. DUDAS
*Director of the United States Patent and Trademark Office*